(12) United States Patent
Wang et al.

(10) Patent No.: US 11,967,820 B2
(45) Date of Patent: Apr. 23, 2024

(54) METHOD AND APPARATUS FOR DEPLOYING POWER QUALITY MONITORING DEVICE

(71) Applicant: Siemens Aktiengesellschaft, Munich (DE)

(72) Inventors: Dan Wang, Chengdu (CN); Jing Li, Beijing (CN); Hao Liu, Beijing (CN); Wen Tao Hua, Beijing (CN); Ang Li, Beijing (CN); Peng Fei Zhang, Beijing (CN)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 18/246,116

(22) PCT Filed: Sep. 21, 2020

(86) PCT No.: PCT/CN2020/116581
§ 371 (c)(1),
(2) Date: Mar. 21, 2023

(87) PCT Pub. No.: WO2022/056926
PCT Pub. Date: Mar. 24, 2022

(65) Prior Publication Data
US 2023/0352972 A1    Nov. 2, 2023

(51) Int. Cl.
*G06F 11/30* (2006.01)
*G01R 19/25* (2006.01)
(Continued)

(52) U.S. Cl.
CPC .... *H02J 13/00002* (2020.01); *G01R 19/2513* (2013.01); *G06F 11/3006* (2013.01); *G06F 11/3062* (2013.01); *G06F 16/285* (2019.01)

(58) Field of Classification Search
CPC ............. H02J 13/00002; G06F 16/285; G06F 11/3006; G06F 11/3062; G01R 19/2513
See application file for complete search history.

(56) References Cited

U.S. PATENT DOCUMENTS

| | | | | |
|---|---|---|---|---|
| 2013/0345993 | A1* | 12/2013 | Bellala | G01F 15/063 |
| | | | | 702/45 |
| 2015/0095000 | A1* | 4/2015 | Patil | G06F 30/13 |
| | | | | 703/2 |

(Continued)

FOREIGN PATENT DOCUMENTS

| | | | | |
|---|---|---|---|---|
| CN | 108 964 282 | | 12/2018 | ............. H02J 13/00 |
| CN | 109 685 579 | | 4/2019 | ............. G06Q 30/02 |

(Continued)

OTHER PUBLICATIONS

Search Report for International Application No. PCT/CN2020/116581, 14 pages, dated Jun. 1-0, 2021.

(Continued)

*Primary Examiner* — Gary Collins
(74) *Attorney, Agent, or Firm* — Slayden Grubert Beard PLLC

(57) ABSTRACT

Various embodiments of the teachings herein include a method for deploying power quality monitoring (PQM) devices. The method may include: determining a maximum number of PQM devices and historical power data of candidate deployment points, wherein the number of the candidate deployment points is greater than the maximum number of the PQM devices; clustering the historical power data of the candidate deployment points, wherein a target number of categories is determined on the basis of a silhouette coefficient of each candidate number of categories and the maximum number of the PQM devices; and determining (Continued)

PQM device deployment points based on the center of each category in the target number of categories.

13 Claims, 5 Drawing Sheets

(51) Int. Cl.
  *G06F 16/28*  (2019.01)
  *H02J 13/00*  (2006.01)

(56) References Cited

U.S. PATENT DOCUMENTS

| | | | |
|---|---|---|---|
| 2020/0067787 A1* | 2/2020 | Patra | H04L 67/12 |
| 2022/0070049 A1* | 3/2022 | Keller | H04L 41/065 |
| 2022/0205967 A1* | 6/2022 | Thoma | H04Q 9/00 |

FOREIGN PATENT DOCUMENTS

| | | | | |
|---|---|---|---|---|
| CN | 109685279 A | 4/2019 | | G06Q 10/04 |
| CN | 111 611 961 | 9/2020 | | G06K 9/00 |

OTHER PUBLICATIONS

Ahmad Asrul Ibrahim et al., "Optimal Placement of Power Quality Monitors in Distribution Systems Using the Topological Monitor Reach Area," Conference Paper, 7 pages, dated Aug. 22, 2011.

Wu, Li-li, et al. "Optimized Allocation of Power Quality Monitoring Based on State Estimation", Journal of Mechanical and Electrical Engineering, vol. 33, No. 3, 6 pages (Chinese w/ English abstract), Mar, 16.

Wan, Yuxin et al., "Optimization of the Power Quality Monitor Number in Smart Grid," 2014 IEEE International Conference on Smart Grid Communications, pp. 230-235, Nov. 3, 2014.

Ahmad, Basel Alsayyed et al., "Review of Power Quality Monitoring Systems," 2015 International Conference on Industrial Engineering and Operations Management, 8 pages, Mar. 3, 2015.

Extended European Search Report, Application No. 20953784.9, 9 pages, Jan. 24, 2024.

* cited by examiner

METHOD AND APPARATUS FOR DEPLOYING POWER QUALITY MONITORING DEVICE

CROSS-REFERENCE TO RELATED APPLICATIONS

This application is a U.S. National Stage Application of International Application No. PCT/CN2020/116581 filed Sep. 21, 2020, which designates the United States of America, the contents of which are hereby incorporated by reference in their entirety.

TECHNICAL FIELD

The present disclosure relates to electric power. Various embodiments of the teachings herein include methods and/or apparatus for deploying power quality monitoring (PQM) devices.

BACKGROUND

Power quality is not only linked to the safe and economical operation of power grid companies, but also affects safe operation and product quality at the user end. The incorporation of large numbers of distributed energy sources (such as wind power and solar power generation) worsens power quality further. Continuous monitoring and analytical evaluation of power quality information are prerequisites for discovering power quality issues and raising the level of power quality.

A PQM system uses PQM devices installed at the power grid side or the user side to transmit monitoring data back to a monitoring center over a network, achieving simultaneous monitoring of multiple locations, and issuing power quality related information; this is an effective means of performing power quality monitoring and evaluation. To ensure that industrial parks and business parks, etc. have a steady supply of power, PQM devices need to be deployed in many places. However, PQM devices are expensive, and the optimization of PQM device deployment points is very important.

PQM deployment points are typically decided according to personal specialist knowledge and experience, thus increasing the difficulty of deployment. Furthermore, deployment points that are decided by individuals might not be optimized, with the result that unimportant regions are subjected to excessive monitoring, or monitoring of important regions is neglected.

SUMMARY

The teachings of the present disclosure include methods and apparatus for deploying PQM devices. For example, some embodiments include a method for deploying PQM devices, the method comprising: determining a maximum number of PQM devices and historical power data of candidate deployment points, wherein the number of the candidate deployment points is greater than the maximum number of the PQM devices; clustering the historical power data of the candidate deployment points, wherein a target number of categories is determined on the basis of a silhouette coefficient of each candidate number of categories and the maximum number of the PQM devices; and determining PQM device deployment points based on the center of each category in the target number of categories.

In some embodiments, the historical power data comprises at least one of the following: current values within a predetermined time; voltage values within a predetermined time; power values within a predetermined time; temperature values within a predetermined time.

In some embodiments, the method (100) further comprises determining the candidate deployment points from amongst transformer deployment points, each transformer deployment point being located between a power distribution room and a power grid.

In some embodiments, the step of determining a target number of categories on the basis of a silhouette coefficient of each candidate number of categories and the maximum number of the PQM devices, comprises: determining a maximum value of a silhouette coefficient of each candidate number of categories; and when the maximum value is less than or equal to the maximum number of the PQM devices, determining the candidate number of categories corresponding to the maximum value to be the target number of categories.

In some embodiments, the step of determining a target number of categories on the basis of a silhouette coefficient of each candidate number of categories and the maximum number of the PQM devices, comprises: determining a maximum value of a silhouette coefficient of each candidate number of categories; when the maximum value is greater than the maximum number of the PQM devices, determining a subset T in a silhouette coefficient set containing the silhouette coefficient of each candidate number of categories, wherein each silhouette coefficient in the subset T is less than or equal to the maximum number of the PQM devices, and all silhouette coefficients in the silhouette coefficient set except for the subset T are greater than the maximum number of the PQM devices; and determining the candidate number of categories corresponding to a maximum value in the subset T to be the target number of categories.

In some embodiments, the step of determining (103) PQM device deployment points based on the center of each category in the target number of categories, comprises: deploying a PQM device at a candidate deployment point when the center of a category coincides with the candidate deployment point; when the center of a category does not coincide with a candidate deployment point, deploying a PQM device at a candidate deployment point that is at the closest distance from the center of the category, wherein said distance includes at least one of the following: Euclidean distance; Manhattan distance; Chebyshev distance; cosine similarity; Mahalanobis distance; Minkowski distance.

As another example, some embodiments include an apparatus (400) for deploying PQM devices, characterized in that the apparatus (400) comprises: a first determining module (402), for determining a maximum number of PQM devices and historical power data of candidate deployment points, wherein the number of the candidate deployment points is greater than the maximum number of the PQM devices; a clustering module (403), for clustering the historical power data of the candidate deployment points, wherein a target number of categories is determined on the basis of a silhouette coefficient of each candidate number of categories and the maximum number of the PQM devices; and a second determining module (404), for determining PQM device deployment points based on the center of each category in the target number of categories.

In some embodiments, the historical power data comprises at least one of the following: current values within a predetermined time; voltage values within a predetermined time; power values within a predetermined time; temperature values within a predetermined time.

In some embodiments, the apparatus (400) further comprises a third determining module (401), for determining transformer deployment points to be the candidate deployment points, each transformer deployment point being located between a power distribution room and a power grid.

In some embodiments, the clustering module (403) is configured to determine a maximum value of a silhouette coefficient of each candidate number of categories; and when the maximum value is less than or equal to the maximum number of the PQM devices, determine the candidate number of categories corresponding to the maximum value to be the target number of categories.

In some embodiments, the clustering module (403) is configured to determine a maximum value of a silhouette coefficient of each candidate number of categories; when the maximum value is greater than the maximum number of the PQM devices, determine a subset T in a silhouette coefficient set containing the silhouette coefficient of each candidate number of categories, wherein each silhouette coefficient in the subset T is less than or equal to the maximum number of the PQM devices, and all silhouette coefficients in the silhouette coefficient set except for the subset T are greater than the maximum number of the PQM devices; and determine the candidate number of categories corresponding to a maximum value in the subset T to be the target number of categories.

In some embodiments, the second determining module (404) is configured to deploy a PQM device at a candidate deployment point when the center of a category coincides with the candidate deployment point; and when the center of a category does not coincide with a candidate deployment point, deploy a PQM device at a candidate deployment point that is at the closest distance from the center of the category, wherein said distance includes at least one of the following: Euclidean distance; Manhattan distance; Chebyshev distance; cosine similarity; Mahalanobis distance; Minkowski distance.

As another example, some embodiments include an apparatus (500) for deploying PQM devices, characterized by comprising: a processor (501) and a memory (502); wherein an application program executable by the processor (501) is stored in the memory (502), for causing the processor (501) to perform one or more of the methods (100) for deploying PQM devices as described herein.

As another example, some embodiments include a computer-readable storage medium, characterized in that computer-readable instructions are stored therein, the computer-readable instructions being used to perform one or more of the methods (100) for deploying PQM devices as described herein.

KEY TO THE FIGURES

Figure 1:
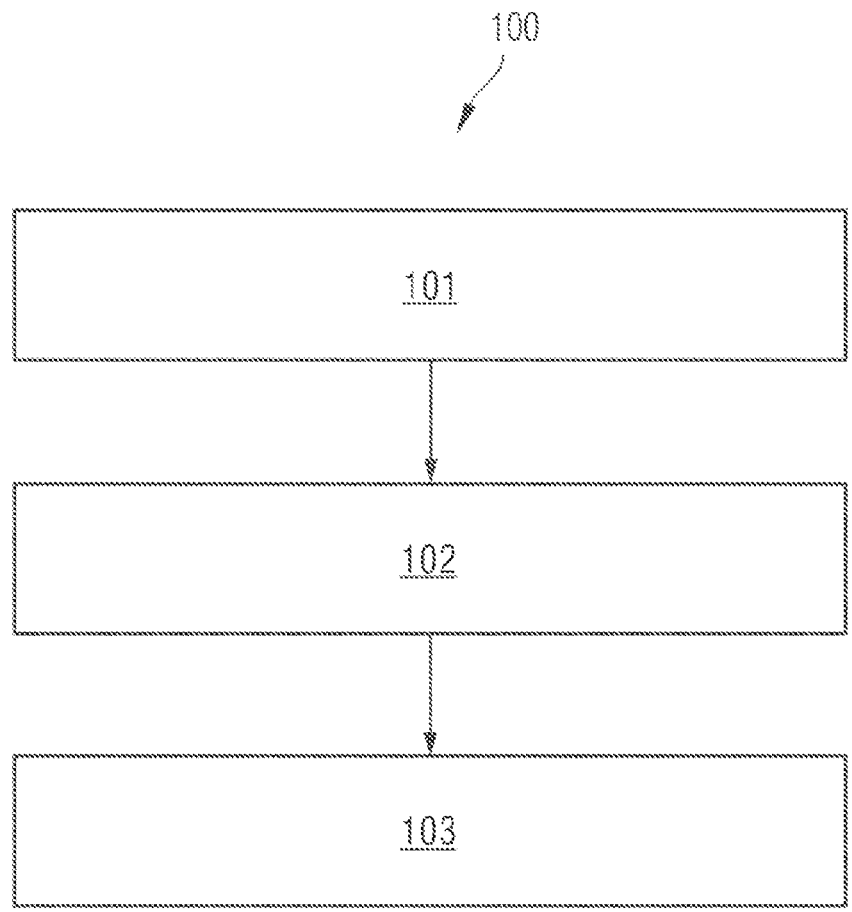
FIG. 1 is a flow chart showing an example method for deploying PQM devices incorporating teachings of the present disclosure.

| Label | Meaning |
| --- | --- |
| 100 | Method for deploying PQM devices |
| 101-103 | Steps |
| 20, 30, 40 | Classes |
| 51 | Commercial electric load |
| 52 | Auxiliary connection apparatus |
| 53 | Industrial electric load |
| 54 | Power distribution room |
| 55 | PQM device |
| 56 | Power grid |
| 400 | Apparatus for deploying PQM devices |
| 401 | Third determining module |
| 402 | First determining module |
| 403 | Clustering module |
| 404 | Second determining module |
| 500 | Apparatus for deploying PQM devices |
| 501 | Processor |
| 502 | memory |

DETAILED DESCRIPTION

As can be seen, in the various embodiments of the present invention, clustering is performed on the basis of historical power data of candidate deployment points, wherein the silhouette coefficient of each candidate number of categories and the maximum number of PQM devices are used together to limit the target number of categories, and PQM device deployment points are then determined on the basis of the center of each category corresponding to the target number of categories, thus achieving the automatic determining of PQM device deployment points and reducing the difficulty of deployment. Moreover, clustering based on historical power data of candidate deployment points and optimized design of the target number of categories also improves the clustering result, further ensuring that deployment positions are optimized.

In some embodiments, the historical power data comprises at least one of the following: current values within a predetermined time; voltage values within a predetermined time; power values within a predetermined time; temperature values within a predetermined time. Thus, various embodiments of historical power data are possible.

In some embodiments, the method further comprises determining the candidate deployment points from amongst transformer deployment points, each transformer deployment point being located between a power distribution room and a power grid. As can be seen, the reliability of candidate deployment points is increased by determining the candidate deployment points from amongst transformer deployment points, each transformer deployment point being located between a power distribution room and a power grid.

In some embodiments, determining a target number of categories on the basis of a silhouette coefficient of each candidate number of categories and the maximum number of the PQM devices, comprises: determining a maximum value of a silhouette coefficient of each candidate number of categories; and when the maximum value is less than or equal to the maximum number of the PQM devices, determining the candidate number of categories corresponding to the maximum value to be the target number of categories. Thus, when all of the silhouette coefficients are small, the number of PQM device deployments can be reduced by determining the candidate number of categories corresponding to the maximum value to be the target number of categories, thereby saving costs.

In some embodiments, determining a target number of categories on the basis of a silhouette coefficient of each candidate number of categories and the maximum number of the PQM devices, comprises determining a maximum value of a silhouette coefficient of each candidate number of categories; and when the maximum value is greater than the maximum number of the PQM devices, determining a subset T in a silhouette coefficient set containing the silhouette coefficient of each candidate number of categories, wherein each silhouette coefficient in the subset T is less than or equal to the maximum number of the PQM devices, and all silhouette coefficients in the silhouette coefficient set except for the subset T are greater than the maximum number of the PQM devices; and determining the candidate number of categories corresponding to a maximum value in the subset T to be the target number of categories. As can be seen, when all of the silhouette coefficients are large, the candidate number of categories with the best clustering result may be chosen, thereby optimizing deployment performance.

In some embodiments, determining PQM device deployment points based on the center of each category in the target number of categories, comprises: deploying a PQM device at a candidate deployment point when the center of a category coincides with the candidate deployment point; and when the center of a category does not coincide with a candidate deployment point, deploying a PQM device at a candidate deployment point that is at the closest distance from the center of the category, wherein said distance includes at least one of the following: Euclidean distance; Manhattan distance; Chebyshev distance; cosine similarity; Mahalanobis distance; Minkowski distance. Thus, deployment performance is optimized by using the centers of the categories obtained by clustering to deploy the PQM devices.

Some embodiments include an apparatus for deploying PQM devices, the apparatus comprising: a first determining module, for determining a maximum number of PQM devices and historical power data of candidate deployment points, wherein the number of the candidate deployment points is greater than the maximum number of the PQM devices; a clustering module, for clustering the historical power data of the candidate deployment points, wherein a target number of categories is determined on the basis of a silhouette coefficient of each candidate number of categories and the maximum number of the PQM devices; and a second determining module, for determining PQM device deployment points based on the center of each category in the target number of categories. As can be seen, clustering is performed on the basis of historical power data of candidate deployment points, wherein the silhouette coefficient of each candidate number of categories and the maximum number of PQM devices are used together to limit the target number of categories, and PQM device deployment points are then determined on the basis of the center of each category corresponding to the target number of categories, thus achieving the automatic determining of PQM device deployment points and reducing the difficulty of deployment. Moreover, clustering based on historical power data of candidate deployment points and optimized design of the target number of categories also improves the clustering result, further ensuring that deployment positions are optimized.

In some embodiments, the historical power data comprises at least one of the following: current values within a predetermined time; voltage values within a predetermined time; power values within a predetermined time; temperature values within a predetermined time. Thus, various embodiments of historical power data are possible.

In some embodiments, the apparatus further comprises a third determining module, for determining transformer deployment points to be the candidate deployment points, each transformer deployment point being located between a power distribution room and a power grid. As can be seen, the reliability of candidate deployment points is increased by determining the candidate deployment points from amongst transformer deployment points, each transformer deployment point being located between a power distribution room and a power grid.

In some embodiments, the clustering module is configured to determine a maximum value of a silhouette coefficient of each candidate number of categories; and when the maximum value is less than or equal to the maximum number of the PQM devices, determine the candidate number of categories corresponding to the maximum value to be the target number of categories. Thus, when all of the silhouette coefficients are small, the number of PQM device deployments can be reduced by determining the candidate number of categories corresponding to the maximum value to be the target number of categories, thereby saving costs.

In some embodiments, the clustering module is configured to determine a maximum value of a silhouette coefficient of each candidate number of categories; when the maximum value is greater than the maximum number of the PQM devices, determine a subset T in a silhouette coefficient set containing the silhouette coefficient of each candidate number of categories, wherein each silhouette coefficient in the subset T is less than or equal to the maximum number of the PQM devices, and all silhouette coefficients in the silhouette coefficient set except for the subset T are greater than the maximum number of the PQM devices; and determine the candidate number of categories corresponding to a maximum value in the subset T to be the target number of categories. As can be seen, when all of the silhouette coefficients are large, the candidate number of categories with the best clustering result may be chosen, thereby optimizing deployment performance.

In some embodiments, the second determining module is configured to deploy a PQM device at a candidate deployment point when the center of a category coincides with the candidate deployment point; and when the center of a category does not coincide with a candidate deployment point, deploy a PQM device at a candidate deployment point that is at the closest distance from the center of the category, wherein said distance includes at least one of the following: Euclidean distance; Manhattan distance; Chebyshev distance; cosine similarity; Mahalanobis distance; Minkowski distance. Thus, deployment performance is optimized by using the centers of the categories obtained by clustering to deploy the PQM devices.

Some embodiments include an apparatus for deploying PQM devices, characterized by comprising: a processor and a memory; wherein an application program executable by the processor is stored in the memory, for causing the processor to perform one or more of the methods for deploying PQM devices as described herein. As can be seen, a deployment apparatus with a processor-memory architecture, thus achieving the automatic determining of PQM device deployment points and reducing the difficulty of deployment. Moreover, clustering based on historical power data of candidate deployment points and optimized design of the target number of categories also improves the clustering result, further ensuring that deployment positions are optimized.

Some embodiments include a computer-readable storage medium, having computer-readable instructions stored therein, the computer-readable instructions being used to perform one or more of the methods for deploying PQM devices as described herein. Thus, a computer-readable storage medium storing computer-readable instructions, thus achieving the automatic determining of PQM device deployment points and reducing the difficulty of deployment. Moreover, clustering based on historical power data of candidate deployment points and optimized design of the target number of categories also improves the clustering result, further ensuring that deployment positions are optimized.

The teachings of the present disclosure are described in further detail below in conjunction with the drawings and embodiments. It should be understood that the particular embodiments described here are merely intended to describe the teachings in an explanatory way, not to limit the scope of protection thereof.

To make the description concise and visually direct, the solution is explained below by describing some example embodiments. The many details in the embodiments are merely intended to assist with understanding the solution of the present disclosure. However, as will be obvious, the technical solutions need not be limited to these details when implemented. To avoid obfuscating unnecessarily, some embodiments are not described in detail, instead being merely outlined. Hereinbelow, "comprising" means "including but not limited to", and "according to . . . " means "at least according to . . . , but not limited to only according to . . . ". Where the quantity of a component is not specifically indicated hereinbelow due to the linguistic customs of Chinese, this means that the component in question may be one or more, or may be understood to mean at least one.

FIG. 1 is a flow chart showing an example method for deploying PQM devices incorporating teachings of the present disclosure. As shown in FIG. 1, the method 100 comprises:

step 101: determining a maximum number of PQM devices and historical power data of candidate deployment points. Here, the maximum number of PQM devices may be determined on the basis of cost accounting conditions. For example, supposing that the deployment cost budget is 600,000 RMB, with each PQM device costing 40,000, then the maximum number of PQM devices is determined to be 15.

In some embodiments, the maximum number of PQM devices may also be determined based on inventory conditions. For example, if the total number of available PQM devices in a known inventory is 20, then the maximum number of PQM devices can be determined to be 20.

The candidate deployment points are predetermined positions where PQM devices might be deployed. In some embodiments, considering the importance of transformer location, a transformer deployment point between a power distribution room and the power grid is determined to be a candidate deployment point.

Here, historical power data of candidate deployment points comprises at least one of the following: current values within a predetermined time; voltage values within a predetermined time; power values within a predetermined time; temperature values within a predetermined time, etc. When transformer deployment points are determined as candidate deployment points, historical power data of the candidate deployment points can be conveniently sought from a database recording historical power data of transformers.

Typical examples of determining the maximum number of PQM devices and historical power data of candidate deployment points have been described demonstratively above, but those skilled in the art will realize that such a description is merely demonstrative, and not intended to limit the embodiments of the present invention.

Step 102: clustering the historical power data of candidate deployment points, wherein a target number of categories is determined on the basis of a silhouette coefficient of each candidate number of categories and the maximum number of the PQM devices. The meaning of clustering shall first be explained. The process of splitting a set of physical or abstract objects into multiple classes composed of similar objects is called clustering. A cluster (i.e. category) generated by clustering is a set of data objects, which are similar to objects in the same cluster but different from objects in other clusters.

In some embodiments, a vector model containing each dimension (i.e. data type) in historical power data may be determined in advance. For each candidate deployment point, historical statistical data of each dimension of this candidate deployment point is respectively assigned into the vector model; the vector model resulting from this assignment is then a vector of historical power data of this candidate deployment point, and thus facilitates clustering based on vector distance.

Clustering algorithms that may be used in embodiments of the present invention include but are not limited to: clustering algorithms based on partitioning, clustering algorithms based on levels, clustering algorithms based on density, clustering algorithms based on grids, clustering algorithms based on neural networks or clustering algorithms based on statistics, etc.

In some embodiments, clustering algorithms include: the k-means algorithm, k-modes algorithm, k-prototypes algorithm or k-medoids algorithm, etc. the dimension used in clustering may be any dimension in a vector model used in historical power data, or a combination of at least two dimensions. A vector distance algorithm such as a Euclidean distance algorithm, Manhattan distance algorithm, Mahalanobis distance algorithm or Minkowski distance algorithm may be used to determine a vector distance between a vector of each candidate deployment point and a vector of another candidate deployment point.

Figure 2:
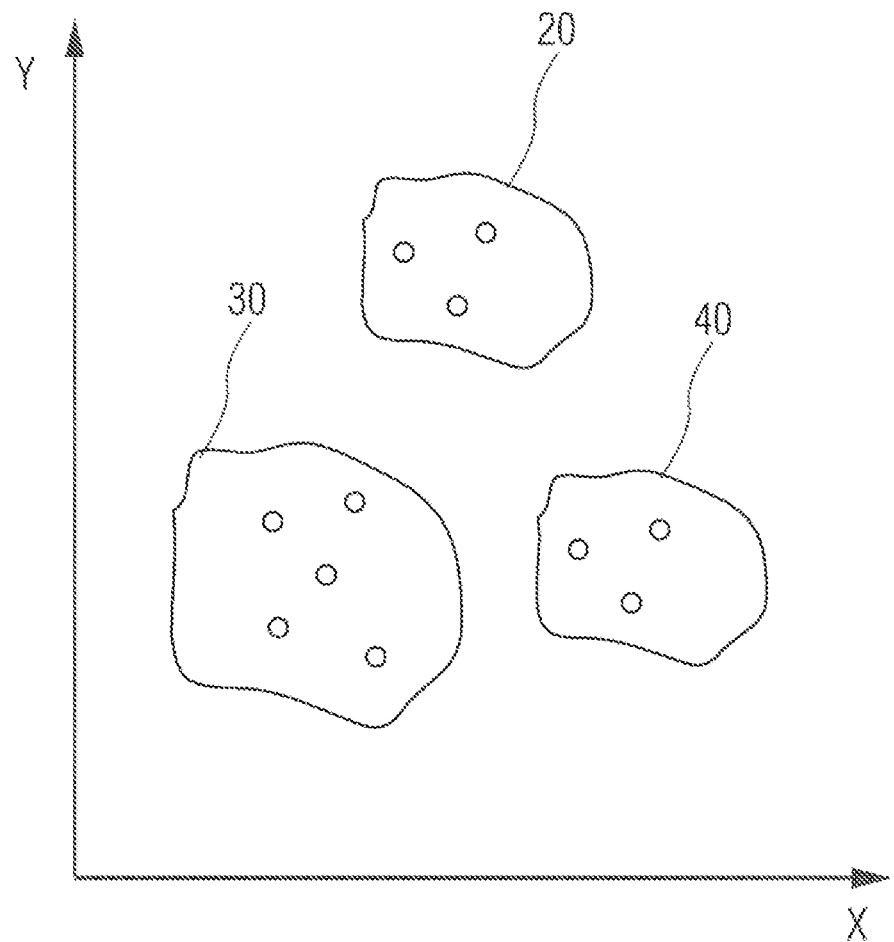
FIG. 2 is a demonstrative schematic diagram of a clustering result incorporating teachings of the present disclosure.

FIG. 2 is a demonstrative schematic diagram showing a clustering result in an example embodiment of the present disclosure. As can be seen, candidate deployment points are clustered into three classes (class 20, class 30 and class 40) on two dimensions on the horizontal axis X and the vertical axis Y. A demonstrative clustering result has been described above taking two dimensions as an example. Those skilled in the art will realize that a different number of dimensions is also possible (e.g. 1, 3, 4 or more), and the teachings of the present disclosure are not subject to any limitations in this respect.

The silhouette coefficient is a way of evaluating how good the clustering result is. It combines two factors: cohesion and separation. It may be used to evaluate different algorithms based on the same original data, or the effects of different ways of running an algorithm on the clustering result. For example, historical power data (data to be classified) of candidate deployment points is clustered, for example using the K-means clustering algorithm, dividing the data to be classified into K clusters (categories).

In some embodiments, the range of values of K is [2, (maximum number of PQM devices−1)]. For each point in each cluster, their silhouette coefficients can be respectively computed. For a point i therein: a(i) and b(i) are computed; then the silhouette coefficient S(i) of point i is:

$$s(i) = \frac{b(i) - a(i)}{\max\{a(i), b(i)\}}$$

where a(i) is the mean value of the degree of non-similarity between point i and other points in the same cluster; b(i) is the minimum value of the mean degree of non-similarity between point i and other clusters; and max( ) is a function to find the maximum value. If S(i) is close to 1, this indicates that the clustering of sample i is rational; if S(i) is close to −1, this indicates that sample i should be classified in another cluster; if S(i) is approximately 0, this indicates that sample i is at the boundary of two clusters.

The mean value of S(i) of all points is called the silhouette coefficient of the clustering result of each candidate number of categories. That is, the mean value of the silhouette coefficients of all points is the silhouette coefficient of the clustering result when there are K clusters.

For each K value, a corresponding clustering result silhouette coefficient is computed, i.e. the silhouette coefficient of each candidate number of categories is computed. The target number of categories can then be determined on the basis of the silhouette coefficient of each candidate number of categories and the maximum number of PQM devices.

In some embodiments, determining the target number of categories on the basis of the silhouette coefficient of each candidate number of categories and the maximum number of PQM devices comprises: determining a maximum value of the silhouette coefficient of each candidate number of categories; when the maximum value is less than or equal to the maximum number of the PQM devices, determining the candidate number of categories corresponding to the maximum value to be the target number of categories.

As an example, suppose that the maximum number of PQM devices is 30, the silhouette coefficient of each candidate number of categories is less than 30, and the maximum value in the silhouette coefficients of the candidate numbers of categories is 25; then it can be determined that the target number of categories is 25, i.e. that the final K value is 25. PQM device deployment points may then be determined using the centers of the 25 categories obtained by clustering.

In some embodiments, determining the target number of categories on the basis of the silhouette coefficient of each candidate number of categories and the maximum number of the PQM devices comprises: determining a maximum value of the silhouette coefficient of each candidate number of categories; when the maximum value is greater than the maximum number of the PQM devices, determining a subset T in a silhouette coefficient set containing the silhouette coefficient of each candidate number of categories, wherein each silhouette coefficient in the subset T is less than or equal to the maximum number of the PQM devices, and all silhouette coefficients in the silhouette coefficient set except for the subset T are greater than the maximum number of the PQM devices; and determining the candidate number of categories corresponding to a maximum value in the subset T to be the target number of categories.

As an example, suppose that the maximum number of PQM devices is 30; when the maximum value in the silhouette coefficients of the candidate numbers of categories is 40, the maximum value (40) cannot be chosen as the target number of categories because the maximum value (40) is greater than the maximum number (30) of PQM devices. In this case, a subset T is determined in a silhouette coefficient set containing the silhouette coefficient of each candidate number of categories, wherein each silhouette coefficient in the subset T is less than or equal to the maximum number (40) of PQM devices, and all silhouette coefficients in the silhouette coefficient set except for the subset T are greater than the maximum number (40) of PQM devices. The candidate number of categories corresponding to the maximum value in the subset T is then determined to be the target number of categories. In other words, the silhouette coefficient of the target number of categories that is determined must not only be less than the maximum number of PQM devices, but must also be the maximum value in the subset T containing all less than the maximum number. For example, suppose that the target number of categories finally determined is 20; then the final K value is determined to be 20.

PQM device deployment points may then be determined using the centers of the 20 categories obtained by clustering.

Step 103: determining PQM device deployment points based on the center of each category in the target number of categories. In some embodiments, when the center of a category coincides with a candidate deployment point, a PQM device is deployed at the candidate deployment point. In some embodiments, a single PQM device is arranged at the coincident candidate deployment point.

In some embodiments, when the center of a category does not coincide with a candidate deployment point, a PQM device is deployed at a candidate deployment point that is at the closest distance from the center of the category, wherein said distance includes at least one of the following: Euclidean distance; Manhattan distance; Chebyshev distance; cosine similarity; Mahalanobis distance; Minkowski distance, etc. Preferably, a single PQM device is arranged at the candidate deployment point that is at the closest distance from the center of the category.

As an example, suppose that the target number of categories determined in step 102 is 10; then 10 categories are obtained by clustering. These 10 categories each have their own category center, i.e. there are 10 category centers. For each of these 10 categories, a judgment is respectively made as to whether the category center coincides with a candidate deployment point; if it does coincide, then the coincident candidate deployment point is determined to be a deployment point of this category, and a PQM device is deployed at this candidate deployment point; if the category center does not coincide with a candidate deployment point, then a candidate deployment point that is at the closest distance from the category center is determined to be a deployment point of this category, and a PQM device is deployed at this candidate deployment point.

In some embodiments, a single PQM device is arranged at each deployment point, so the actual total number of deployments of PQM devices is equal to the target number of categories. In some embodiments, at the deployment points, the PQM devices can measure and analyse the quality of AC power supplied to a user power-receiving end by a public power grid, wherein the measurement and analysis indices include: power supply frequency deviation, power supply voltage deviation, power supply voltage fluctuation and flicker, permitted imbalance in power supply three-phase voltage, unstable time-varying signal harmonics measured and analysed using wavelet transform in power grid harmonics, etc. The PQM devices may also measure and analyse the effects which various electrical devices have on public power grid power quality in different operating states. Reactive compensation and filter device dynamic parameters in the power system are tested and analysed, and a quantitative evaluation of the functionality and technical indices thereof is provided.

The procedure shown in FIG. 1 may be especially suitable for application sites that require a stable supply of power, such as industrial parks and business parks. Suppose that an industrial park has 100 candidate deployment points x1, x2 . . . x100, where PQM devices need to be separately deployed. However, the number of PQM devices is limited; there are only funds for 30 PQM devices at the most (i.e. the maximum number of PQM devices is 30), so the PQM devices must be deployed selectively. Each candidate deployment point has its own historical power data, wherein the historical power data of all of the candidate deployment points have the same data type.

A clustering algorithm is used to perform K-means clustering using Euclidean distance. Moreover, silhouette coefficients are used to define a suitable number of categories. An illustration is given taking the generation of 10 classes c1, c2, c3, c4 . . . c10 as an example: each class has a center, so there are 10 centers in total, namely m1, m2 . . . m10. These centers might be real candidate deployment points, or might be computed virtual candidate deployment points. For each point, a silhouette coefficient s of that point is computed, giving a total of s1, s2 . . . s100. The mean value of the silhouette coefficients s of these 100 points is then found, K=mean(s1, s2 . . . s100), and this value is recorded as K10 (corresponding to division into 10 classes).

Referring to the demonstrative illustration above, the number of categories may be classified from 2 to 99, and a set of silhouette coefficients (K2, K3, K4, . . . , K99) may be separately computed. The number of categories corresponding to the silhouette coefficient value with the maximum value in this set is the most suitable number of categories.

For example, suppose that K22 is the maximum value; then the most suitable number of categories is 22, and 22 is less than the maximum number (30) of PQM devices, so it is sufficient to deploy 22 PQM devices, thus saving 8 PQM devices.

In another example, K44 is the maximum value in the set of silhouette coefficients, so the most suitable number of categories is 44, but 44 is greater than the maximum number (30) of PQM devices; in this case, the second-largest silhouette coefficient is sought, and if the second-largest silhouette coefficient is still greater than 30, we continue to search downward, until a silhouette coefficient less than or equal to 30 is found.

Figure 3:
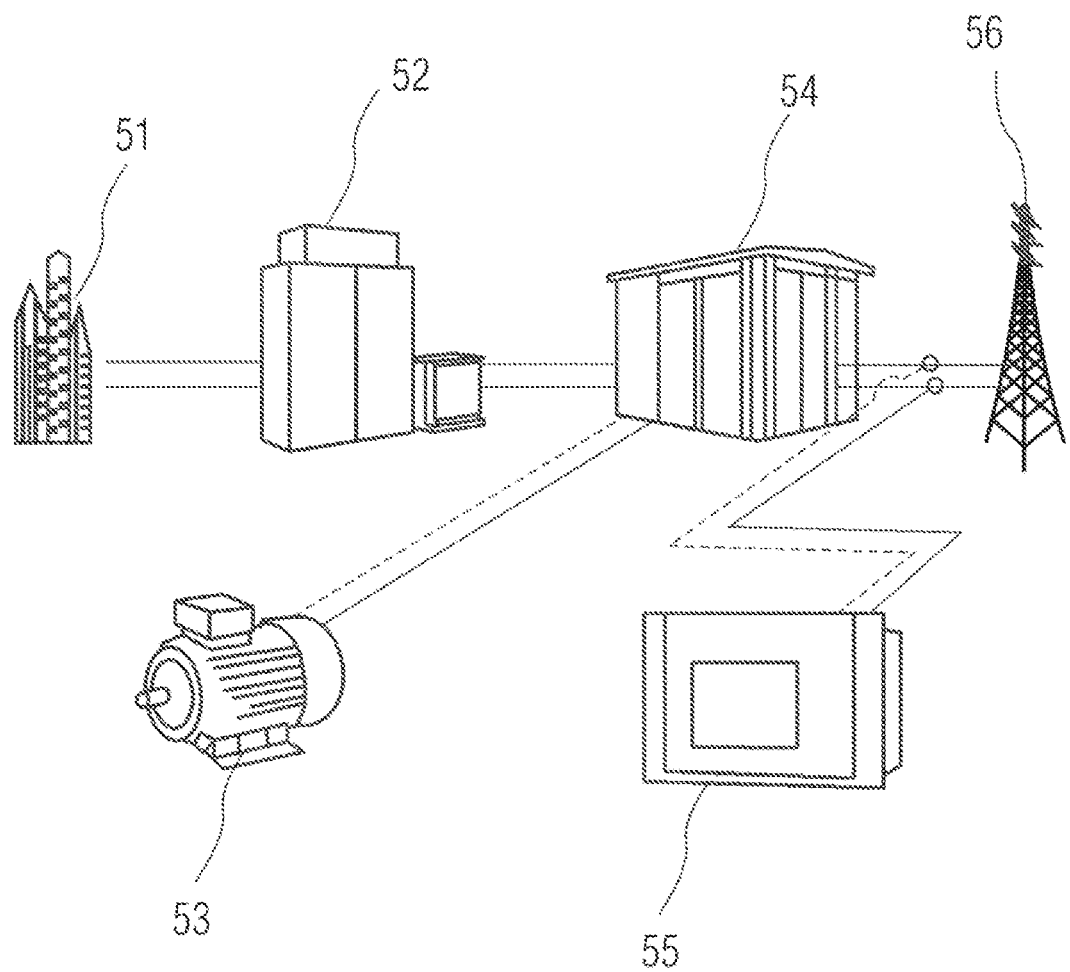
FIG. 3 is a demonstrative schematic diagram of deployment positions of PQM devices incorporating teachings of the present disclosure.

FIG. 3 is a demonstrative schematic diagram of deployment positions of PQM devices incorporating teachings of the present disclosure. As can be seen from FIG. 3, a commercial electric load 51 is connected to a power distribution room 54 via an auxiliary connection apparatus 52. An industrial electric load 53 is connected to the power distribution room 54. The power distribution room 54 is connected to a power grid 56. A transformer deployment point between the power distribution room 54 and the power grid 56 may be determined as a candidate deployment point.

Figure 4:
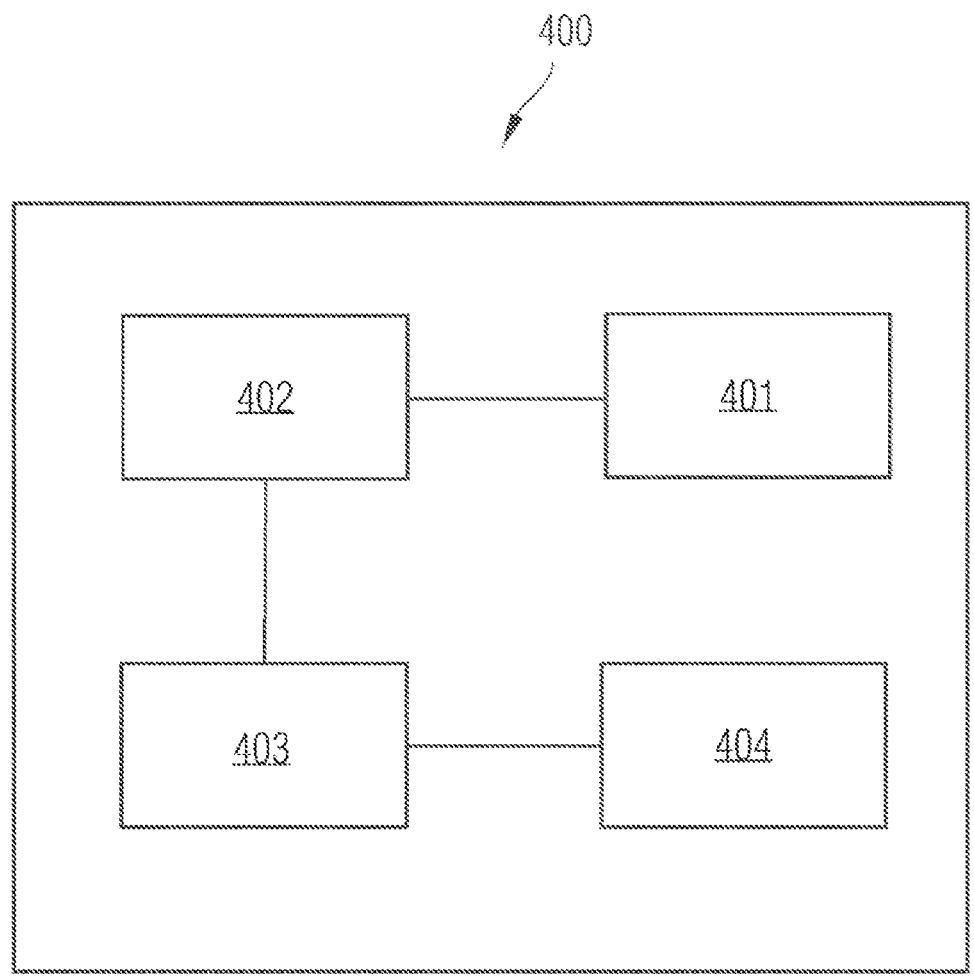
FIG. 4 is a structural diagram showing an apparatus for deploying PQM devices incorporating teachings of the present disclosure.

FIG. 4 is a structural diagram of an example apparatus for deploying PQM devices incorporating teachings of the present disclosure. As shown in FIG. 4, the apparatus 400 comprises:
 a first determining module 402, for determining a maximum number of PQM devices and historical power data of candidate deployment points, wherein the number of the candidate deployment points is greater than the maximum number of the PQM devices;
 a clustering module 403, for clustering the historical power data of the candidate deployment points, wherein a target number of categories is determined on the basis of a silhouette coefficient of each candidate number of categories and the maximum number of the PQM devices;
 a second determining module 404, for determining PQM device deployment points based on the center of each category in the target number of categories.

In some embodiments, the historical power data comprises at least one of the following: current values within a predetermined time; voltage values within a predetermined time; power values within a predetermined time; temperature values within a predetermined time, etc.

In some embodiments, the apparatus 400 further comprises: a third determining module 401, for determining a transformer deployment point between a power distribution room and a power grid to be the candidate deployment point.

In some embodiments, the clustering module 403 is configured to determine a maximum value of the silhouette coefficient of each candidate number of categories; and when the maximum value is less than or equal to the maximum number of the PQM devices, determine the candidate number of categories corresponding to the maximum value to be the target number of categories.

In some embodiments, the clustering module 403 is configured to determine a maximum value of the silhouette coefficient of each candidate number of categories; and when the maximum value is greater than the maximum number of the PQM devices, determine a subset T in a silhouette coefficient set containing the silhouette coefficient of each candidate number of categories, wherein each silhouette coefficient in the subset T is less than or equal to the maximum number of the PQM devices, and all silhouette coefficients in the silhouette coefficient set except for the subset T are greater than the maximum number of the PQM devices; and determine the candidate number of categories corresponding to a maximum value in the subset T to be the target number of categories.

In some embodiments, the second determining module (404) is configured to deploy a PQM device at a candidate deployment point when the center of a category coincides with the candidate deployment point; and when the center of a category does not coincide with a candidate deployment point, deploy a PQM device at a candidate deployment point that is at the closest distance from the center of the category, wherein said distance includes at least one of the following: Euclidean distance; Manhattan distance; Chebyshev distance; cosine similarity; Mahalanobis distance; Minkowski distance, etc.

Figure 5:
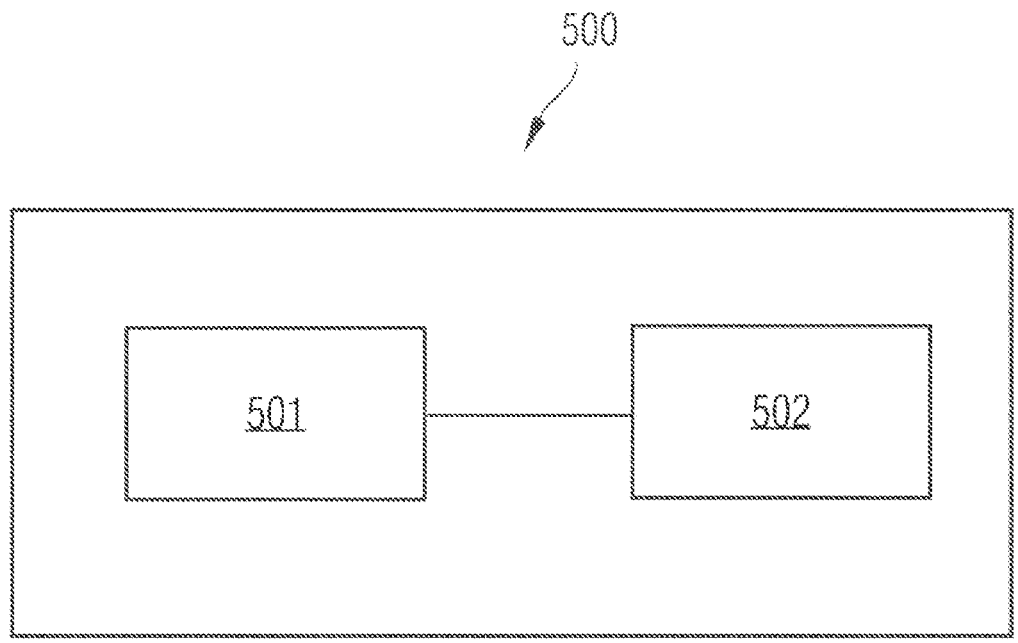
FIG. 5 is a structural diagram of an example apparatus for deploying PQM devices which has a memory-processor architecture incorporating teachings of the present disclosure.

FIG. 5 is a block diagram of an example apparatus for deploying PQM devices which has a memory-processor architecture incorporating teachings of the present disclosure. As shown in FIG. 5, the apparatus 500 for deploying PQM devices comprises a processor 501, a memory 502, and a computer program which is stored on the memory 502 and capable of being run on the processor 501; when the computer program is executed by the processor 501, the PQM device deployment method in any of the above embodiments is implemented.

The memory may specifically be implemented as a variety of storage media, such as electrically erasable programmable read-only memory (EEPROM), flash memory, and programmable read-only memory (PROM). The processor 501 may be implemented to include one or more central processors or one or more field programmable gate arrays, wherein the field programmable gate array integrates one or more central processor cores. Specifically, the central processor or central processor core may be implemented as a CPU or MCU or DSP, etc.

It must be explained that not all of the steps and modules in the procedures and structural drawings above are necessary; certain steps or modules may be omitted according to actual needs. The order in which the steps are performed is not fixed, and may be adjusted as needed. The division of modules is merely functional division adopted to facilitate description; in practice, one module may be realized by multiple modules, and the functions of multiple modules may be realized by the same module, and these modules may be located in the same device or different devices.

Hardware modules in the embodiments may be realized mechanically or electronically. For example, a hardware module may include a specially designed permanent circuit or logic device (such as a dedicated processor, such as an FPGA or ASIC) for performing specific operations. A hardware module may also include a programmable logic device or circuit configured temporarily by software (e.g. including a general-purpose processor or another programmable processor) for performing specific operations. The decision to specifically use a mechanical method or a dedicated permanent circuit or a temporarily configured circuit (e.g. configured by software) to realize a hardware module may be made on the basis of cost and time considerations.

Some embodiments include a machine-readable storage medium, storing instructions for causing a machine to perform the method described herein. Specifically, a system or apparatus equipped with a storage medium may be provided, wherein software program code realizing the functions of any one of the above embodiments is stored on the storage medium, and a computer (or CPU or MPU) of the system or apparatus may be caused to read and execute the program code stored in the storage medium. In addition, an operating system operating on a computer, etc. may be made to complete some or all of the actual operations by means of instructions based on program code. Program code read out from the storage medium may also be written into a memory installed in an expansion board inserted in the computer, or written into a memory installed in an expansion unit connected to the computer, and thereafter instructions based on the program code make a CPU etc. installed on the expansion board or expansion unit execute some or all of the actual operations, so as to realize the functions of any of the embodiments above. Embodiments of storage media used to provide program code include floppy disks, hard disks, magneto-optical disks, optical disks (e.g. CD-ROM, CD-R, CD-RW, DVD-ROM, DVD-RAM, DVD-RW, DVD+RW), magnetic tape, non-volatile memory cards and ROM. Optionally, program code may be downloaded from a server computer or cloud over a communication network.

The above are merely example embodiments of the present teachings, which are not intended to limit the scope of protection thereof.

Any amendments, equivalent substitutions or improvements, etc. made within the spirit and principles of the present disclosure should be included in the scope of protection thereof.

What is claimed is:

1. A method for deploying power quality monitoring (PQM) devices, the method comprising:
   determining a maximum number of PQM devices and historical power data of candidate deployment points, wherein the number of the candidate deployment points is greater than the maximum number of the PQM devices;
   clustering the historical power data of the candidate deployment points, wherein a target number of categories is determined on the basis of a silhouette coefficient of each candidate number of categories and the maximum number of the PQM devices; and
   determining PQM device deployment points based on the center of each category in the target number of categories.

2. The method for deploying PQM devices as claimed in claim 1, wherein the historical power data comprises at least one of the following:
   current values within a predetermined time; voltage values within a predetermined time, power values within a predetermined time, and temperature values within a predetermined time.

3. The method for deploying PQM devices as claimed in claim 1, the method further comprising:
   determining the candidate deployment points from amongst transformer deployment points, each transformer deployment point located between a power distribution room and a power grid.

4. The method for deploying PQM devices as claimed in claim 1, wherein determining a target number of categories on the basis of a silhouette coefficient of each candidate number of categories and the maximum number of the PQM devices comprises:
   determining a maximum value of a silhouette coefficient of each candidate number of categories; and
   when the maximum value is less than or equal to the maximum number of the PQM devices, determining the candidate number of categories corresponding to the maximum value to be the target number of categories.

5. The method for deploying PQM devices as claimed in claim 1, wherein determining a target number of categories on the basis of a silhouette coefficient of each candidate number of categories and the maximum number of the PQM devices comprises
   determining a maximum value of a silhouette coefficient of each candidate number of categories;
   when the maximum value is greater than the maximum number of the PQM devices, determining a subset T in a silhouette coefficient set containing the silhouette coefficient of each candidate number of categories, wherein each silhouette coefficient in the subset T is less than or equal to the maximum number of the PQM devices, and all silhouette coefficients in the silhouette coefficient set except for the subset T are greater than the maximum number of the PQM devices; and
   determining the candidate number of categories corresponding to a maximum value in the subset T to be the target number of categories.

6. The method for deploying PQM devices as claimed in claim 1, wherein determining PQM device deployment points based on the center of each category in the target number of categories, comprises:
  deploying a PQM device at a candidate deployment point when the center of a category coincides with the candidate deployment point;
  when the center of a category does not coincide with a candidate deployment point, deploying a PQM device at a candidate deployment point that is at the closest distance from the center of the category, wherein said distance includes at least one of the following:
  Euclidean distance; Manhattan distance; Chebyshev distance; cosine similarity; Mahalanobis distance; Minkowski distance.

7. An apparatus for deploying PQM devices, the apparatus comprising:
  a first determining module for determining a maximum number of PQM devices and historical power data of candidate deployment points, wherein the number of the candidate deployment points is greater than the maximum number of the PQM devices;
  a clustering module for clustering the historical power data of the candidate deployment points, wherein a target number of categories is determined on the basis of a silhouette coefficient of each candidate number of categories and the maximum number of the PQM devices; and
  a second determining module for determining PQM device deployment points based on the center of each category in the target number of categories.

8. The apparatus for deploying PQM devices as claimed in claim 7, wherein the historical power data comprises at least one of the following:
  current values within a predetermined time, voltage values within a predetermined time, power values within a predetermined time, and temperature values within a predetermined time.

9. The apparatus for deploying PQM devices as claimed in claim 7, the apparatus further comprising:
  a third determining module for determining transformer deployment points to be the candidate deployment points, each transformer deployment point being located between a power distribution room and a power grid.

10. The apparatus for deploying PQM devices as claimed in claim 7, wherein
  the clustering module is configured to determine a maximum value of a silhouette coefficient of each candidate number of categories; and when the maximum value is less than or equal to the maximum number of the PQM devices, determine the candidate number of categories corresponding to the maximum value to be the target number of categories.

11. The apparatus for deploying PQM devices as claimed in claim 7, wherein
  the clustering module is configured to determine a maximum value of a silhouette coefficient of each candidate number of categories; when the maximum value is greater than the maximum number of the PQM devices, determine a subset T in a silhouette coefficient set containing the silhouette coefficient of each candidate number of categories, wherein each silhouette coefficient in the subset T is less than or equal to the maximum number of the PQM devices, and all silhouette coefficients in the silhouette coefficient set except for the subset T are greater than the maximum number of the PQM devices; and determine the candidate number of categories corresponding to a maximum value in the subset T to be the target number of categories.

12. The apparatus for deploying PQM devices as claimed in claim 7, wherein
  the second determining module is configured to deploy a PQM device at a candidate deployment point when the center of a category coincides with the candidate deployment point; and when the center of a category does not coincide with a candidate deployment point, deploy a PQM device at a candidate deployment point that is at the closest distance from the center of the category, wherein said distance includes at least one of the following:
  Euclidean distance; Manhattan distance; Chebyshev distance; cosine similarity; Mahalanobis distance; Minkowski distance.

13. An apparatus for deploying PQM devices, the apparatus comprising:
  a processor;
  a memory storing an application program executable by the processor causing the processor to:
  determine a maximum of PQM devices and historical power data of candidate deployment points, wherein the number of the candidate deployment points is greater than the maximum number of the PQM devices;
  cluster the historical power data of the candidate deployment points, wherein a target number of categories is determine on the basis of a silhouette coefficient of each candidate number of categories and the maximum number of the PQM devices; and
  determine PQM device deployment points based on the center of each category in the target number of categories.

* * * * *